(12) United States Patent
Pan

(10) Patent No.: US 12,130,334 B2
(45) Date of Patent: Oct. 29, 2024

(54) STATE OF HEALTH DETERMINATION OF A BATTERY

(71) Applicant: Fitbit LLC, San Francisco, CA (US)

(72) Inventor: Lawrence Shou-pung Pan, Pleasanton, CA (US)

(73) Assignee: FITBIT LLC, San Francisco, CA (US)

( * ) Notice: Subject to any disclaimer, the term of this patent is extended or adjusted under 35 U.S.C. 154(b) by 746 days.

(21) Appl. No.: 17/379,246

(22) Filed: Jul. 19, 2021

(65) Prior Publication Data

US 2023/0014216 A1 Jan. 19, 2023

(51) Int. Cl.
| | |
|---|---|
| *H02J 7/00* | (2006.01) |
| *G01R 31/3842* | (2019.01) |
| *G01R 31/392* | (2019.01) |
| *G04G 17/08* | (2006.01) |
| *H01M 10/42* | (2006.01) |

(52) U.S. Cl.
CPC ....... *G01R 31/392* (2019.01); *G01R 31/3842* (2019.01); *G04G 17/08* (2013.01); *H01M 10/4257* (2013.01); *H02J 7/0048* (2020.01); *H02J 7/005* (2020.01); *H02J 7/00712* (2020.01)

(58) Field of Classification Search
None
See application file for complete search history.

(56) References Cited

U.S. PATENT DOCUMENTS

| | | | |
|---|---|---|---|
| 8,258,751 B2 * | 9/2012 | Esnard | H01M 10/44 324/426 |
| 9,229,064 B2 | 1/2016 | Chou et al. | |
| 10,345,383 B2 * | 7/2019 | Mullen | G01R 31/382 |
| 10,989,761 B2 * | 4/2021 | Montaru | G01R 31/392 |
| 11,101,669 B2 * | 8/2021 | Patey | G01R 31/3832 |
| 11,215,674 B2 * | 1/2022 | Markochev | G01R 31/371 |
| 11,215,675 B2 * | 1/2022 | Shin | G01R 31/3835 |
| 2020/0191876 A1 | 6/2020 | Shin et al. | |
| 2022/0294235 A1 * | 9/2022 | Syouda | H02J 7/0048 |

FOREIGN PATENT DOCUMENTS

KR  102013306 B1  8/2019

* cited by examiner

*Primary Examiner* — Leigh M Garbowski
(74) *Attorney, Agent, or Firm* — DORITY & MANNING P.A.

(57) ABSTRACT

A computer-implemented method for improved determination of state of health (SoH) of a battery of a device can include determining that the device is in a charging state such that a charge of the battery is increased over a charge procedure; determining that a state of charge (SoC) metric of the battery reported by a battery gauge system has increased by a fixed SoC interval; determining a charge time interval over which the SoC metric of the battery has increased by the fixed SoC interval; and determining a SoH metric indicative of the SoH of the battery based at least in part on the charge time interval; wherein determining the SoH metric is based at least in part on a known relationship between a reference time interval representative of time required to increase a reference battery at full SoH by the fixed SoC interval and the charge time interval.

20 Claims, 6 Drawing Sheets

STATE OF HEALTH DETERMINATION OF A BATTERY

FIELD

The present disclosure relates generally to state of health determination of a battery. More particularly, the present disclosure relates to battery-powered devices, such as wearable devices having determination of improved state of health of a battery of the battery-powered device.

BACKGROUND

Rechargeable batteries can be recharged to provide power to electronic devices, such as wearable devices. Rechargeable batteries tend to degrade in performance over time, due in part to time (e.g., calendar life) and/or usage (e.g., cycle life). It can be challenging to monitor how much a given battery has degraded due to these factors. This may be particularly problematic in the case of electronic devices that have been stored for a considerable period of time or devices that are refurbished with batteries of unknown quality. A state of health (SOH) measurement reflects the health of the battery with respect to a full health of an, e.g., newly manufactured battery or other battery at maximum health.

SUMMARY

Aspects and advantages of embodiments of the present disclosure will be set forth in part in the following description, or can be learned from the description, or can be learned through practice of the embodiments.

One example aspect of the present disclosure is directed to a wearable device having improved determination of state of health of a battery of the wearable device. The wearable device can include a device housing. The wearable device can include a battery disposed within at least a portion of the device housing. The wearable device can include a battery gauge system configured to provide a state of charge metric indicative of a state of charge of the battery. The wearable device can include one or more processors. The wearable device can include one or more non-transitory computer-readable media storing instructions, that, when implemented, cause the one or more processors to perform operations. The operations can include determining that the wearable device is in a charging state such that a charge of the battery is increased over a charge procedure. The operations can include determining that the state of charge metric of the battery reported by the battery gauge system has increased by a fixed state of charge interval. The operations can include determining a charge time interval over which the state of charge metric of the battery has increased by the fixed state of charge interval. The operations can include determining a state of health metric indicative of the state of health of the battery based at least in part on the charge time interval. Determining the state of health metric can be based at least in part on a known relationship between a reference time interval representative of time required to increase a reference battery at full state of health by the fixed state of charge interval and the charge time interval.

Another example aspect of the present disclosure is directed to a computer-implemented method for improved determination of state of health of a battery of a battery-powered device. The computer-implemented method can include determining, by one or more processors, that the battery-powered device is in a charging state such that a charge of the battery is increased over a charge procedure. The computer-implemented method can include determining, by the one or more processors, that a state of charge metric of the battery, reported by a battery gauge system, has increased by a fixed state of charge interval. The computer-implemented method can include determining, by the one or more processors, a charge time interval over which the state of charge metric of the battery has increased by the fixed state of charge interval. The computer-implemented method can include determining, by the one or more processors, a state of health metric indicative of the state of health of the battery based at least in part on the charge time interval. Determining the state of health metric can be based at least in part on a known relationship between a reference time interval representative of time required to increase a reference battery at full state of health by the fixed state of charge interval and the charge time interval.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which makes reference to the appended figures, in which.

Figure 1:
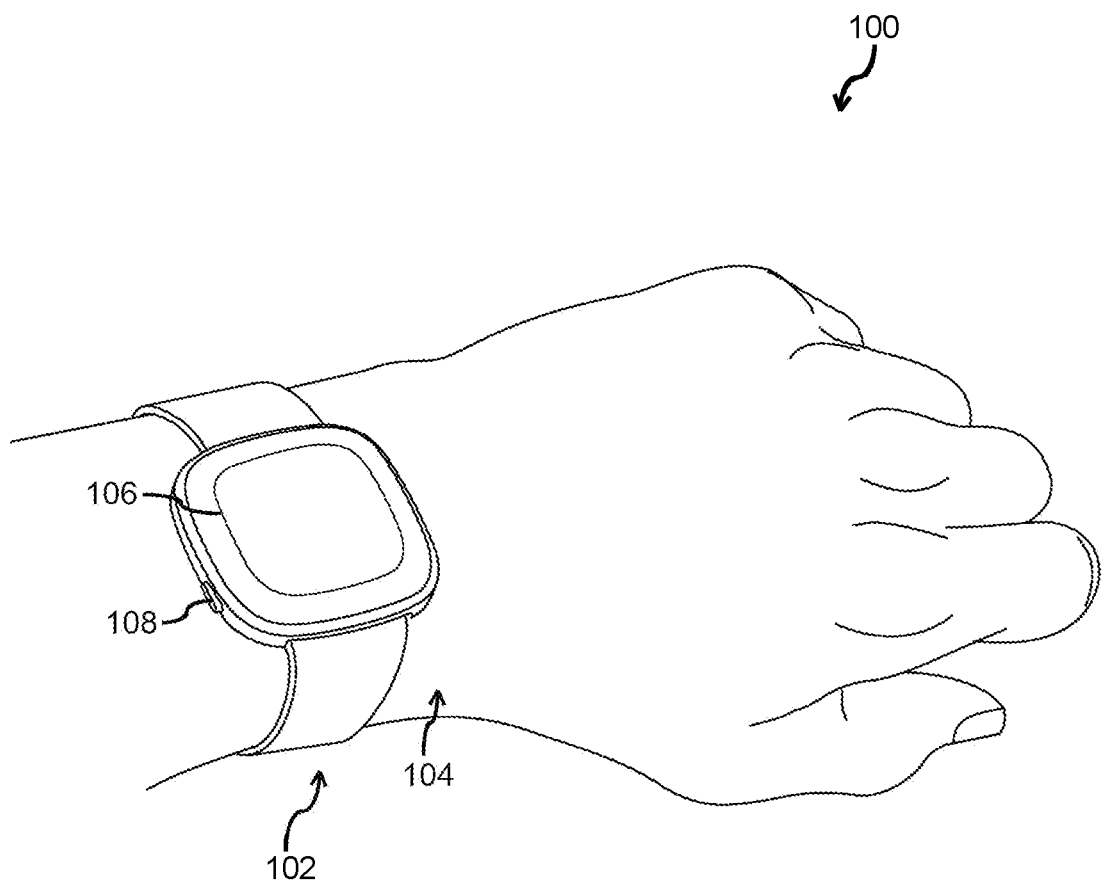
FIG. 1 depicts a perspective view of an example wearable device (e.g., an example smartwatch) on a wrist of a user according to example embodiments of the present disclosure.

Reference numerals that are repeated across plural figures are intended to identify the same features in various implementations.

DETAILED DESCRIPTION

Generally, the present disclosure is directed to state of health determination of a battery. A battery, such as a rechargeable battery, can be recharged over a charge procedure such that a charge of the battery is increased over the charge procedure. For instance, the battery may be discharged during use of the battery. The battery may be returned to a state of increased charge during the charge procedure. During the charge procedure, the battery may be placed into a charging state such that a charge of the battery is increased while the battery is in the charging state, over a charge procedure. For instance, the battery may be coupled to a battery charger during the charge procedure. The battery charger may be configured to supply a current and/or voltage signal to recharge the battery during the charge procedure.

More particularly, the present disclosure relates to battery-powered devices, such as wearable devices having improved determination of state of health of a battery of the battery-powered device. A wearable device, such as a smartwatch, fitness tracker, activity tracker, pedometer, wearable electrocardiogram (ECG or EKG) device, etc., may include a battery, such as a rechargeable battery. For instance, the wearable device may include a device housing. A battery may be disposed within at least a portion of the device housing. For instance, the device housing may define an interior and/or the battery may be disposed within the interior of the device housing. The state of health of the battery can be a representation of the health of the battery as a percentage of total battery capacity compared to an initial capacity of the battery when initially manufactured.

The wearable device can additionally include a battery gauge system. The battery gauge system can be a "fuel gauge" system. The battery gauge system can be configured to provide a state of charge metric indicative of a state of charge of the battery. For instance, the state of charge metric can be indicative of a percentage of charge (e.g., from empty at 0% to fully charged at 100%) with respect to time of use of the device. The battery gauge system can be configured to provide the state of charge metric indicative of the state of charge of the battery based at least in part on one or more battery charge factors. The one or more battery charge factors can include factors that affect a battery state of charge, such as, but not limited to, one or more of a measured battery voltage, a reference battery voltage, battery age, battery temperature, battery current draw, battery usage, battery transient status, battery chemistry, battery model, battery make, or one or more calibration factors. The state of charge metric can be expressed in any suitable manner. In some implementations, for example, the state of charge metric is expressed incrementally as a percentage between a fully charged state of the battery and an empty state of the battery.

As one example, a battery can have a characteristic curve that illustrates a relationship between voltage of the battery and state of charge of the battery. The characteristic curve may be altered by other battery charge factors (e.g., temperature). For instance, an idling device may follow a predictable curve between voltage and state of charge that provides a unique state of charge for each voltage. The curve may be characterized based on battery chemistry, model, etc. However, use of the device can draw current, thus affecting the voltage, and thereby making the curve for an idling device inaccurate. Additionally, transients, temperature, age, and other factors may affect the characteristic curve in a manner which may be correlated. Thus, based on the characteristic curve, the voltage of the battery, and/or one or more of the battery charge factors, the state of charge of the battery can thus be estimated at a given point in time with high accuracy by the battery gauge system. Additionally and/or alternatively, some battery gauge systems may measure state of charge of the battery when the battery is at rest, to avoid some battery charge factors such as transients or usage.

Batteries will degrade in performance over either or both of time (e.g., calendar life) and/or usage (e.g., cycle life). It can be difficult to tell how much a battery has degraded due to these factors. This is particularly problematic when devices including batteries have been stored for a considerable period of time, or devices are refurbished with batteries of unknown quality. Some existing methods for estimating state of health of a battery can suffer from significant drawbacks. Some battery management systems attempt to optimize battery performance over the life of the battery. Some systems are based on pulsed measurements to estimate the impedance of the battery which naturally grows as the battery ages. However, impedance measurement can be unreliable, as impedance growth with age can vary from supplier to supplier and/or among unique batteries. Furthermore, impedance measurement can be sensitive to temperature of the battery and/or the device. Additionally and/or alternatively, some approaches involve additional hardware, which may increase cost of a device.

Generally, however, the battery gauge system can be accurate to a high degree over a variety of battery conditions including age, temperature, usage, etc. Because of this, the state of charge measurement from the battery gauge system can be reliable, including over aging batteries. This, in turn, can provide a reliable and useful means for estimating state of health of a battery according to example aspects of the present disclosure.

Notably, the state of charge measurement from the battery gauge system can be accurate even over changes in maximum capacity of the battery. For example, if a new battery has a maximum capacity of 100 mAh, but over time and/or usage degrades to a maximum capacity of 70 mAh, the battery gauge system can provide an accurate reading of, for example, 100% when the battery is full and/or other accurate incremental state of charge measurements regardless of how much the battery has degraded.

Thus, example aspects of the present disclosure recognize that, assuming the reported state of charge from the battery gauge system is desirably accurate for any particular battery, even for degraded batteries, the state of charge can be useful in estimating state of health of the battery. In particular, the state of health of a battery can be estimated based at least in part on a measured time over which a constant current charger adds a fixed amount to state of charge. Similarly, the state of health of a battery can be estimated based at least in part on a measured state of charge increase over a given period of time at constant current charging. In particular, when the charger current does not vary, the time required to charge a battery over a fixed increase in state of charge can directly relate to the maximum capacity of the battery and, in turn, the state of health of the battery.

For instance, a fixed state of charge increase (e.g., 50%) will correspond to a greater amount of charge for a battery whose maximum capacity is 100 mAh (e.g., 50%=50 mAh) than for a battery whose maximum capacity is 70 mAh (e.g., 50%=35 mAh). Furthermore, consider that a charger charges at 100 mA. In this case, it will take a half hour (e.g., 30 minutes) to add 50% SoC (e.g., 50 mAh) to the battery having 100 mAh maximum capacity and 0.35 hours (e.g., 21 minutes) to add 50% SoC (e.g., 35 mAh) to the battery having 70 mAh maximum capacity. Thus, by measuring the time required to add a given percentage to state of charge, it is possible to estimate the total capacity of the battery and, thus, the state of health of the battery.

More generally, example aspects of the present disclosure provide for determining state of health of a battery as a ratio of state of charge change, under constant current, for the battery relative to the state of charge change under the same constant current for a reference, new battery. For instance, a first rate of state of charge change over time can be determined for the battery and compared to a second rate of state of charge change over time for a reference battery. This ratio of first rate to second rate can be the state of health of the battery (e.g., expressed as a percentage). As an example, a first ratio of arbitrary state of charge change to the time required for the arbitrary state of charge change under constant current for a battery can be compared to a second ratio of arbitrary state of charge change to the time required for the arbitrary state of charge change under constant current of a new battery. This comparison can be the state of health.

It is noted that it is assumed that the charger provides constant current during a time period over which the state of charge increase is observed. In this regard, it may be desirable and/or necessary to limit the state of charge increase to a portion of the state of charge over which the charger charges in a constant current mode. For instance, some chargers operate by charging at a constant current until a battery reaches some maximum allowable voltage, then switches to constant voltage charging (e.g., at the maximum allowable voltage) and tapers the current until the battery is at full charge. In this case, the approach described herein may only be applicable when the battery is being charged in the constant current mode (e.g., when the voltage of the battery is below the maximum allowable voltage). However, since the approach described herein can be applied over a relatively narrow state of charge increase, example aspects of the present disclosure can find application in a number of devices that charge over constant current, even for a relatively brief period, and especially for devices that charge at constant current for a majority of the charge procedure (e.g., at or below about 80% SoC).

Example aspects of the present disclosure are directed to a computer-implemented method for improved determination of state of health of a battery of a wearable device. The method can be implemented on any suitable wearable device. As examples, the wearable device can be a smartwatch, a wearable fitness tracker, a pedometer, a wearable electrocardiogram device, an activity tracker and/or any other suitable (e.g., wearable) device, and/or combination thereof. The wearable device can include one or more processors and one or more non-transitory computer-readable media storing instructions, that, when implemented, cause the one or more processors to perform operations for determining a state of health of the battery. Additionally and/or alternatively, the computer-implemented method may be implemented on a computing system that is separate from the wearable device, such as a charger of the wearable device, a diagnostic system, or any other suitable computing system.

The method can include determining that the wearable device is in a charging state such that a charge of the battery is increased over a charge procedure. For instance, the wearable device may acknowledge that the device has been connected to a charger and/or is charging. As one example, in some implementations, determining that the wearable device is in the charging state can include requesting, from a charger coupled to the battery, a charging signal to be provided to the battery such that the charge of the battery is increased over time and receiving, from the charger coupled to the battery, the charging signal.

In some implementations, the charging state can be a constant current charging state over at least the charge time interval such that the battery receives a fixed (e.g., constant) current over the charge time interval. Additionally and/or alternatively, in some implementations, the charging state is configured to switch from the constant current charging state to a constant voltage charging state during the charge procedure. The charge time interval can be determined prior to the charging state switching from the constant current charging state to the constant voltage charging state. For instance, the charge time interval can occur while the device is in the constant current charging state such that the linear relationship between charge time and charge (e.g., current) is maintained.

Additionally, the computer-implemented method can include determining that the state of charge metric of the battery reported by the battery gauge system has increased by a fixed state of charge interval. The fixed state of charge interval can be any suitable interval, such as, for example, 1%, 5%, 10%, 20%, 30%, 50%, etc. Generally, while a larger state of charge interval can require more charge time to determine, it can be more precise for minor variations in state of charge etc. However, example aspects of the present disclosure can also be applied on smaller state of charge intervals for quicker determination of state of health while maintaining high accuracy.

In some implementations, determining that the state of charge metric of the battery reported by the battery gauge system has increased by the fixed state of charge interval can include obtaining a first state of charge measurement from the battery gauge system at a first time instance. Subsequent to obtaining the first state of charge measurement, determining that the state of charge metric reported by the battery gauge system has increased by the fixed state of charge interval can include obtaining a second state of charge measurement from the battery gauge system at a second time instance. The method can then include determining that the second state of charge measurement differs from the first state of charge measurement by the fixed state of charge interval. For instance, the second state of charge measurement can be subtracted from the first state of charge measurement to determine a present state of charge interval, which can be compared to the fixed state of charge interval.

Additionally, the method can include determining a charge time interval over which the state of charge metric of the battery has increased by the fixed state of charge interval. For instance, in some implementations, determining the charge time interval over which the state of charge metric of the battery has increased by the fixed state of charge interval can include subtracting the first time instance from the second time instance. For instance, the charge time interval can be the difference between the first time instance and the second time instance.

Additionally, the method can include determining a state of health metric indicative of the state of health of the battery based at least in part on the charge time interval. For instance, determining the state of health metric can be based at least in part on a known relationship between a reference time interval representative of time required to increase a reference battery at full state of health by the fixed state of charge interval and the charge time interval. As one example, the state of health metric can be a ratio between the charge time interval and the reference time interval. The ratio can thus represent the ratio between the amount of time required to charge the battery by a fixed state of charge and the time required to charge a full health battery by the same fixed state of charge. This ratio can thus correlate directly to state of health of the batter.

In some implementations, the method can further include providing, by the one or more processors, the state of health metric for display to a user. The state of health metric can be displayed to the user for evaluating a health of the battery. For example, the user may be provided with the state of health metric to make an informed decision on whether the battery should be replaced or serviced. As another example, the user may monitor the state of health of the battery to gauge how long a device will last from full charge.

As another example, the state of health metric can be used (e.g., by a diagnostic technician) to determine if performance issues with the wearable device are a result of a low state of health of the battery and/or additional causes. For instance, the state of health metric may be communicated to a diagnostic system during service of the wearable device. Based on the state of health metric, a user may be able to make an informed decision about which parts (e.g., the battery) of the wearable device need to be serviced to return the wearable device to optimal functionality.

Another example aspect of the present disclosure is directed to a computer-implemented method for improved determination of state of health of a battery of a wearable device. The method can be implemented on any suitable wearable device. As examples, the wearable device can be a smartwatch, a wearable fitness tracker, a pedometer, a wearable electrocardiogram device, an activity tracker and/or any other suitable wearable device, and/or combination thereof. The wearable device can include one or more processors and one or more non-transitory computer-readable media storing instructions, that, when implemented, cause the one or more processors to perform operations for determining a state of health of the battery. Additionally and/or alternatively, the computer-implemented method may be implemented on a computing system that is separate from the wearable device, such as a charger of the wearable device, a diagnostic system, or any other suitable computing system.

The method can include determining that the wearable device is in a charging state such that a charge of the battery is increased over a charge procedure. For instance, the wearable device may acknowledge that the device has been connected to a charger and/or is charging. As one example, in some implementations, determining that the wearable device is in the charging state can include requesting, from a charger coupled to the battery, a charging signal to be provided to the battery such that the charge of the battery is increased over time and receiving, from the charger coupled to the battery, the charging signal.

In some implementations, the charging state can be a constant current charging state over at least the charge time interval such that the battery receives a fixed current over the charge time interval. Additionally and/or alternatively, in some implementations, the charging state is configured to switch from the constant current charging state to a constant voltage charging state during the charge procedure. The charge time interval can be determined prior to the charging state switching from the constant current charging state to the constant voltage charging state. For instance, the charge time interval can occur while the device is in the constant current charging state such that the linear relationship between charge time and current is maintained.

Additionally, the method can include determining, by the one or more processors, that a fixed charge time interval has elapsed during the charge procedure. For instance, once the device is determined to be in a charging state, the device can wait until the fixed charge time interval has elapsed while the device is in the charging state.

Once the charge time interval has elapsed, the method can include determining, by the one or more processors, a measured state of charge increase in a state of charge measurement of the battery, reported by a battery gauge system, over the fixed charge time interval. For instance, the wearable device can record the state of charge of the battery at the beginning of the fixed charge time interval and/or the end of the fixed charge time interval. For example, the method can include obtaining a first state of charge measurement subsequent to determining that the wearable device is in the charging state. Additionally, the method can include obtaining a second state of charge measurement subsequent to determining that the fixed charge time interval has elapsed during the charge procedure. The method can then include determining the measured state of charge increase as the difference between the second state of charge measurement and the first state of charge measurement.

The method can include determining, by the one or more processors, a state of health metric indicative of the state of health of the battery based at least in part on the measured state of charge increase. For instance, determining the state of health metric can be based at least in part on a known relationship between a reference state of charge increase representative of an expected increase in state of charge over the charge time interval of a reference battery at full state of health and the measured state of charge increase. For instance, in some implementations, the state of health metric can be or can include a ratio between the measured state of charge increase and the reference state of charge increase. This ratio can correlate to the state of health of the battery.

In some implementations, the method can further include providing, by the one or more processors, the state of health metric for display to a user. The state of health metric can be displayed to the user for evaluating a health of the battery. For example, the user may be provided with the state of health metric to make an informed decision on whether the battery should be replaced or serviced. As another example, the user may monitor the state of health of the battery to gauge how long a device will last from full charge.

As another example, the state of health metric can be used (e.g., by a diagnostic technician) to determine if performance issues with the wearable device are a result of a low state of health of the battery and/or additional causes. For instance, the state of health metric may be communicated to a diagnostic system during service of the wearable device. Based on the state of health metric, a user may be able to make an informed decision about which parts (e.g., the battery) of the wearable device need to be serviced to return the wearable device to optimal functionality.

Systems and methods according to example aspects of the present disclosure can provide for a number of technical effects and benefits, including improvements to computing technology. As one example, determining a state of health metric indicative of the state of health of the battery based at least in part on the charge time interval (e.g., determining the state of health metric based at least in part on a known relationship between a reference time interval representative of time required to increase a reference battery at full state of health by the fixed state of charge interval and the charge time interval) can provide a reliable and inexpensive approach for estimating state of health of the battery. For instance, systems and methods according to example aspects of the present disclosure can estimate state of health of the battery without requiring any additional hardware (e.g., voltage sensors, current sensors, etc.) that would increase cost of the device, thereby reducing cost of the device. Additionally and/or alternatively, example aspects of the present disclosure can be implemented without significant computational cost. Additionally and/or alternatively, systems and methods according to example aspects of the present disclosure can determine a state of health of the battery over a charge interval that is less than a full charge interval of the battery. This can provide for less time being required to determine the state of health of the battery.

With reference now to the Figures, example embodiments of the present disclosure will be discussed in further detail.

FIG. 1 illustrates a view 100 of an example electronic device 102 being worn on the arm 104 of a user. Electronic devices, such as wearable electronic devices, can interact with a user through a touch-sensitive display 106, one or more mechanical buttons 108, or other such input mechanisms known for such purposes. Such devices can also be configured to communicate wirelessly with another computing device, such as a smartphone owned by the user wearing the electronic device. While a device such as a smartwatch or fitness tracker is shown, it should be understood that various other types of electronic devices can benefit from advantages of the various embodiments as discussed and suggested herein, and as would be apparent to one or ordinary skill in the art in light of the present disclosure. The electronic device 102 can include a battery (not illustrated) configured to provide power for various components of the electronic device 102.

Figure 2:
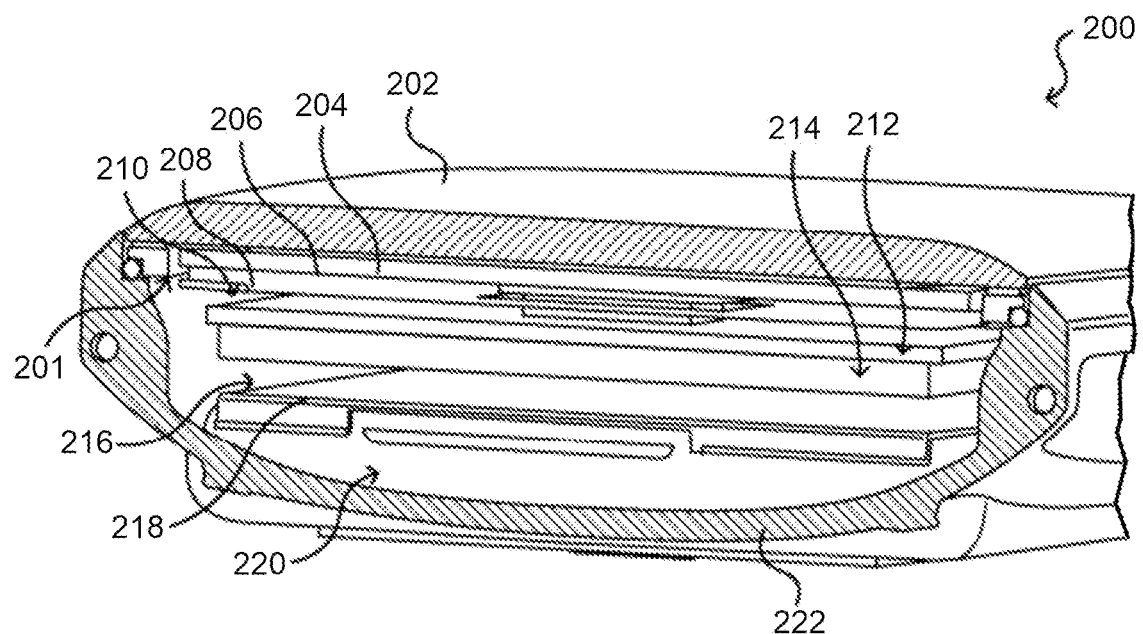
FIG. 2 depicts a schematic diagram of an example wearable device (e.g., an example smartwatch) according to example embodiments of the present disclosure.

FIG. 2 illustrates another cross-sectional view 200 of an example device. In this example, the cover glass 202 overlies the display module 204. There is a gap 206 for the display and touch flexes and the NFC antenna between the display module 204 and the conductive patch 208. A patch antenna back cavity 210 is formed under the conductive patch 208 and above the printed circuit board (PCB) 212 which maintains the resonance mode for the patch antenna. The patch antenna 208 is coupled to the metal housing 222 through the port 201. The port 201 can be a metal spring contact directly coupled from the match patch 208 to the metal housing 222. In some embodiments, the port 201 can be a lumped component coupled from the conductive patch 208 to the metal housing 222 to adjust the resonance mode of the conductive patch 208. The PCB 212 and PCB shield 214 are positioned under the patch antenna back cavity, with the PCB shield formed to reduce electromagnetic interference (EMI) from the nearby components. A battery bracket 218 is used to hold the battery 220 in place within the housing, in this case with respect to the conductive metal housing 222. A slot antenna back cavity 216 is formed between the PCB shield 214 and the battery bracket 218. In some embodiments, a display window is mechanically coupled to the metal housing. The display window and the metal housing can form a sealed enclosure that is water resistant. The device includes a touch module and a display module, with the touch module configured to detect touch input on the display window. The display module is configured to display images or information through the display window.

An example device can include a component layer on a PCB. The component layer can include any appropriate components, as may include microprocessors, RAM (random access memory), ROM (read only memory), ASICs (application specific integrated circuit), FPGAs (field programmable gate array), surface mounted elements, integrated circuits, and the like. The PCB can provide electrical components and circuitry that directs and interprets electrical signals for the device. For example, the PCB can be electrically coupled to the display and touch modules to interpret touch input and to provide images or information to display. The PCB can include a ground plane portion. The PCB can also include a feed clip portion that does not include conductive elements other than where the antenna feed clip is mounted on and electrically coupled to the PCB. For example, the PCB can include a trace that electrically couples the ground plane area to the feed clip area, the feed clip being electrically coupled to the trace in the feed clip area. The ground plane may be provided by a large metalized area, conductive traces in a printed circuit board or flexible printed circuit board, a metal plate and/or surface within the metal housing, etc. The device can also include a vibrating motor to provide haptic feedback or to otherwise mechanically vibrate the device. The PCB can be grounded to the metal housing through one or more grounding screws that electrically couple the PCB to the metal housing. The battery can be about 0.05 mm below the metal plate. In some embodiments, a layer of a non-conductive, low RF loss, rigid material may be inserted to fit in the 0.05 mm gap to attach or otherwise mechanically couple the metal plate to the battery. In some embodiments, the battery is between about 0.01 mm and about 0.1 mm below the metal plate, between about 0.03 mm and about 0.7 mm below the metal plate, or between about 0.04 mm and about 0.06 mm below the metal plate. Between the battery and component layer, there is a dielectric gap (e.g. air or plastic or combination of air and plastic) which creates a back cavity for the slot antenna within an enclosed metal housing design. The dielectric gap may vary in height, but can be used to ensure isolation between the battery to any component on the component layer. The battery can be about 0.48 mm above the component layer. In some embodiments, the battery is between about 0.4 mm and about 0.6 mm above the component layer, between about 0.42 mm and about 0.55 mm above the component layer, or between about 0.45 mm and about 0.5 mm above component layer. In some embodiments, as described herein, a plastic bracket can be placed in this gap to support the battery above the component layer of the PCB.

Figure 3:
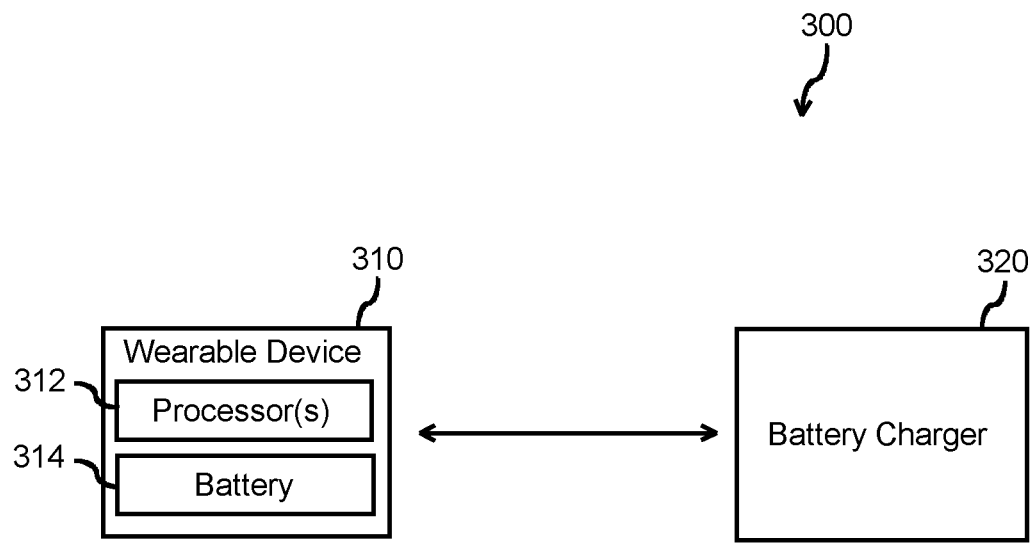
FIG. 3 depicts a block diagram of an example battery charging system according to example embodiments of the present disclosure.

FIG. 3 depicts a block diagram of an example battery charging system 300 according to example embodiments of the present disclosure. The battery charging system 300 can include a wearable device 310. The wearable device 310 can include one or more processors 312. Additionally, the wearable device 310 can include at least one battery 314. The battery 314, such as a rechargeable battery, can be recharged over a charge procedure such that a charge of the battery 314 is increased over the charge procedure. For instance, the battery 314 may be discharged during use of the battery 314 and/or the wearable device 310. The battery 314 may be returned to a state of increased charge during the charge procedure. During the charge procedure, the battery 314 may be placed into a charging state such that a charge of the battery 314 is increased while the battery 314 is in the charging state, over a charge procedure. For instance, the battery 314 can be coupled to a battery charger 320 during the charge procedure. The battery charger 320 may be configured to supply a current and/or voltage signal to recharge the battery 314 during the charge procedure. For instance, the processor(s) 312 may request a current from the charger 320 to charge the battery 314 as described herein.

Figure 4:
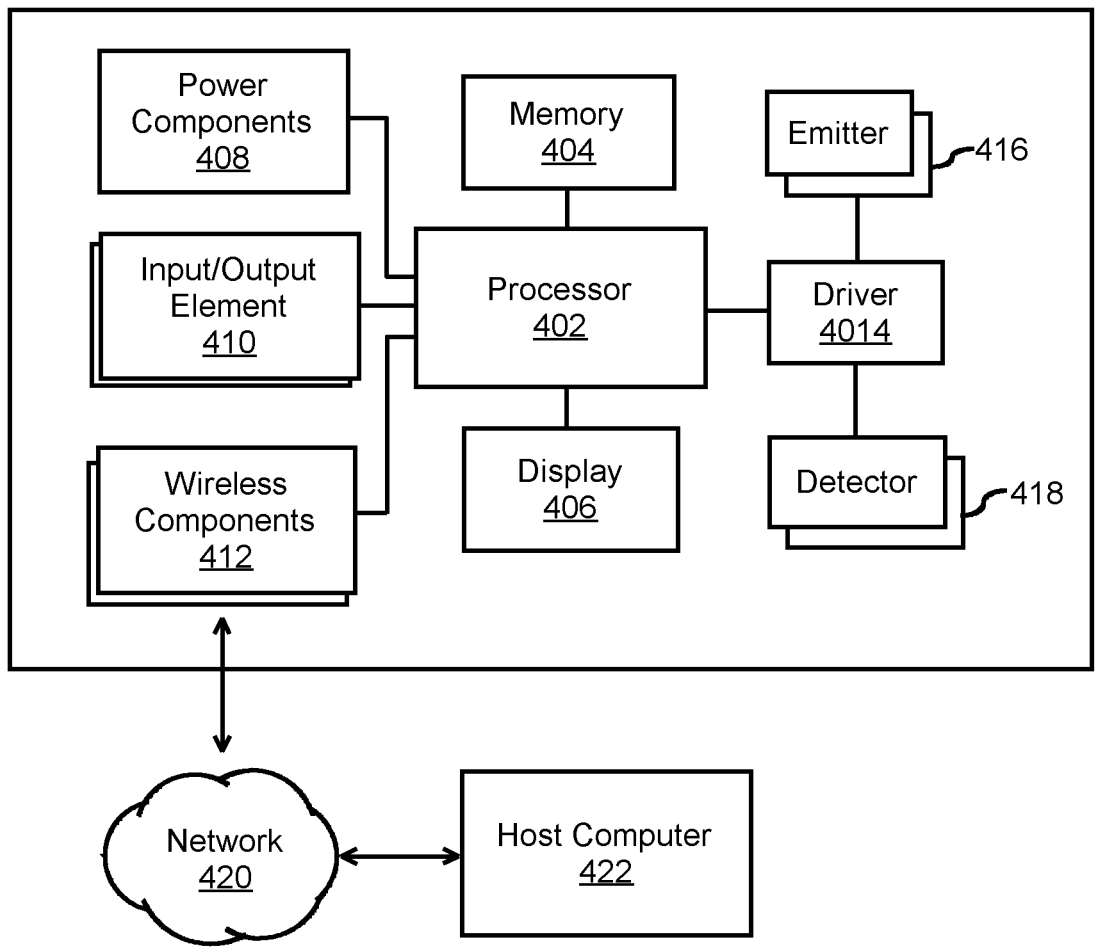
FIG. 4 depicts a block diagram of an example computing system configured to determine state of health of a battery according to example embodiments of the present disclosure.

FIG. 4 illustrates components of an example tracker system 400 that can be utilized in accordance with various embodiments. In this example, the device includes at least one processor 402, such as a central processing unit (CPU) or graphics processing unit (GPU) for executing instructions that can be stored in a memory device 404, such as may include flash memory or DRAM, among other such options. As would be apparent to one of ordinary skill in the art, the device can include many types of memory, data storage, or computer-readable media, such as data storage for program instructions for execution by a processor. The same or separate storage can be used for images or data, a removable memory can be available for sharing information with other devices, and any number of communication approaches can be available for sharing with other devices. The device typically will include some type of display 406, such as a touch screen, organic light emitting diode (OLED), or liquid crystal display (LCD), although devices might convey information via other means, such as through audio speakers or projectors.

A tracker or similar device will include at least one motion detection sensor, which as illustrated can include at least one I/O element 410 of the device. Such a sensor can determine and/or detect orientation and/or movement of the device. Such an element can include, for example, an accelerometer, inertial sensor, altimeter, or gyroscope operable to detect movement (e.g., rotational movement, angular displacement, tilt, position, orientation, motion along a non-linear path, etc.) of the device. An orientation determining element can also include an electronic or digital compass, which can indicate a direction (e.g., north or south) in which the device is determined to be pointing (e.g., with respect to a primary axis or other such aspect). A device may also include an I/O element 410 for determining a location of the device (or the user of the device). Such a positioning element can include or comprise a GPS or similar location-determining element(s) operable to determine relative coordinates for a position of the device. Positioning elements may include wireless access points, base stations, etc., that may either broadcast location information or enable triangulation of signals to determine the location of the device. Other positioning elements may include QR codes, barcodes, RFID tags, NFC tags, etc., that enable the device to detect and receive location information or identifiers that enable the device to obtain the location information (e.g., by mapping the identifiers to a corresponding location). Various embodiments can include one or more such elements in any appropriate combination. The I/O elements may also include one or more biometric sensors, optical sensors, barometric sensors (e.g., altimeter, etc.), and the like.

As mentioned above, some embodiments use the element(s) to track the location and/or motion of a user. Upon determining an initial position of a device (e.g., using GPS), the device of some embodiments may keep track of the location of the device by using the element(s), or in some instances, by using the orientation determining element(s) as mentioned above, or a combination thereof. As should be understood, the algorithms or mechanisms used for determining a position and/or orientation can depend at least in part upon the selection of elements available to the device. The example device also includes one or more wireless components 412 operable to communicate with one or more electronic devices within a communication range of the particular wireless channel. The wireless channel can be any appropriate channel used to enable devices to communicate wirelessly, such as Bluetooth, cellular, NFC, or Wi-Fi channels. It should be understood that the device can have one or more conventional wired communications connections as known in the art. The device also includes one or more power components 408, such as may include a battery operable to be recharged through conventional plug-in approaches, or through other approaches such as capacitive charging through proximity with a power mat or other such device. In some embodiments the device can include at least one additional input/output device 410 able to receive conventional input from a user. This conventional input can include, for example, a push button, touch pad, touch screen, wheel, joystick, keyboard, mouse, keypad, or any other such device or element whereby a user can input a command to the device. These I/O devices could even be connected by a wireless infrared or Bluetooth or other link as well in some embodiments. Some devices also can include a microphone or other audio capture element that accepts voice or other audio commands. For example, a device might not include any buttons at all, but might be controlled only through a combination of visual and audio commands, such that a user can control the device without having to be in contact with the device.

As mentioned, many embodiments will include at least some combination of one or more emitters 416 and one or more detectors 418 for measuring data for one or more metrics of a human body, such as for a person wearing the tracker device. In some embodiments this may involve at least one imaging element, such as one or more cameras that are able to capture images of the surrounding environment and that are able to image a user, people, or objects in the vicinity of the device. The image capture element can include any appropriate technology, such as a CCD image capture element having a sufficient resolution, focal range, and viewable area to capture an image of the user when the user is operating the device. Methods for capturing images using a camera element with a computing device are well known in the art and will not be discussed herein in detail. It should be understood that image capture can be performed using a single image, multiple images, periodic imaging, continuous image capturing, image streaming, etc. Further, a device can include the ability to start and/or stop image capture, such as when receiving a command from a user, application, or other device. The example device includes emitters 416 and detectors 418 capable of being used for obtaining other biometric data, which can be used with example circuitry discussed herein.

If included, a display 406 may provide an interface for displaying data, such as HR, ECG data, blood oxygen saturation (SpO2) levels, and other metrics of the user. In an embodiment, the device includes a wristband and the display is configured such that the display faces away from the outside of a user's wrist when the user wears the device. In other embodiments, the display may be omitted and data detected by the device may be transmitted using the wireless networking interface via near-field communication (NFC), Bluetooth, Wi-Fi, or other suitable wireless communication protocols over at least one network 420 to a host computer 422 for analysis, display, reporting, or other such use.

The memory 404 may comprise RAM, ROM, FLASH memory, or other non-transitory digital data storage, and may include a control program comprising sequences of instructions which, when loaded from the memory and executed using the processor 402, cause the processor 402 to perform the functions that are described herein. The emitters 416 and detectors 418 may be coupled to a bus directly or indirectly using driver circuitry by which the processor 402 may drive the light emitters 416 and obtain signals from the light detectors 418. The host computer 422 communicate with the wireless networking components 412 via one or more networks 420, which may include one or more local area networks, wide area networks, and/or internetworks using any of terrestrial or satellite links. In some embodiments, the host computer 422 executes control programs and/or application programs that are configured to perform some of the functions described herein.

In various embodiments, approaches discussed herein may be performed by one or more of: firmware operating on a monitoring or tracker device or a secondary device, such as a mobile device paired to the monitoring device, a server, host computer, and the like. For example, the monitoring device may execute operations relating to generating signals that are uploaded or otherwise communicated to a server that performs operations for removing the motion components and creating a final estimate value for physiological metrics. Alternatively, the monitoring device may execute operations relating to generating the monitoring signals and removing the motion components to produce a final estimate value for physiological metrics local to the monitoring device. In this case, the final estimate may be uploaded or otherwise communicated to a server such as host computer that performs other operations using the value.

An example monitoring or tracker device can collect one or more types of physiological and/or environmental data from one or more sensor(s) and/or external devices and communicate or relay such information to other devices (e.g., host computer or another server), thus permitting the collected data to be viewed, for example, using a web browser or network-based application. For example, while being worn by the user, a tracker device may perform biometric monitoring via calculating and storing the user's step count using one or more sensor(s). The tracker device may transmit data representative of the user's step count to an account on a web service (e.g., www.fitbit.com), computer, mobile phone, and/or health station where the data may be stored, processed, and/or visualized by the user. The tracker device may measure or calculate other physiological metric(s) in addition to, or in place of, the user's step count. Such physiological metric(s) may include, but are not limited to: energy expenditure, e.g., calorie burn; floors climbed and/or descended; HR; heartbeat waveform; HR variability; HR recovery; respiration, SpO2, blood volume, blood glucose, skin moisture and skin pigmentation level, location and/or heading (e.g., via a GPS, global navigation satellite system (GLONASS), or a similar system); elevation; ambulatory speed and/or distance traveled; swimming lap count; swimming stroke type and count detected; bicycle distance and/or speed; blood glucose; skin conduction; skin and/or body temperature; muscle state measured via electromyography; brain activity as measured by electroencephalography; weight; body fat; caloric intake; nutritional intake from food; medication intake; sleep periods (e.g., clock time, sleep phases, sleep quality and/or duration); pH levels; hydration levels; respiration rate; and/or other physiological metrics.

An example tracker or monitoring device may also measure or calculate metrics related to the environment around the user (e.g., with one or more environmental sensor(s)), such as, for example, barometric pressure, weather conditions (e.g., temperature, humidity, pollen count, air quality, rain/snow conditions, wind speed), light exposure (e.g., ambient light, ultra-violet (UV) light exposure, time and/or duration spent in darkness), noise exposure, radiation exposure, and/or magnetic field. Furthermore, a tracker device (and/or the host computer and/or another server) may collect data from one or more sensors of the device, and may calculate metrics derived from such data. For example, a tracker device may calculate the user's stress or relaxation levels based on a combination of HR variability, skin conduction, noise pollution, and/or sleep quality. In another example, a tracker device may determine the efficacy of a medical intervention, for example, medication, based on a combination of data relating to medication intake, sleep, and/or activity. In yet another example, a tracker device may determine the efficacy of an allergy medication based on a combination of data relating to pollen levels, medication intake, sleep and/or activity. These examples are provided for illustration only and are not intended to be limiting or exhaustive.

An example monitoring device may include a computer-readable storage media reader, a communications device (e.g., a modem, a network card (wireless or wired), an infrared communication device) and working memory as described above. The computer-readable storage media reader can be connected with, or configured to receive, a computer-readable storage medium representing remote, local, fixed and/or removable storage devices as well as storage media for temporarily and/or more permanently containing, storing, transmitting and retrieving computer-readable information. A monitoring system and various devices also typically will include a number of software applications, modules, services or other elements located within at least one working memory device, including an operating system and application programs such as a client application or Web browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Figure 5:
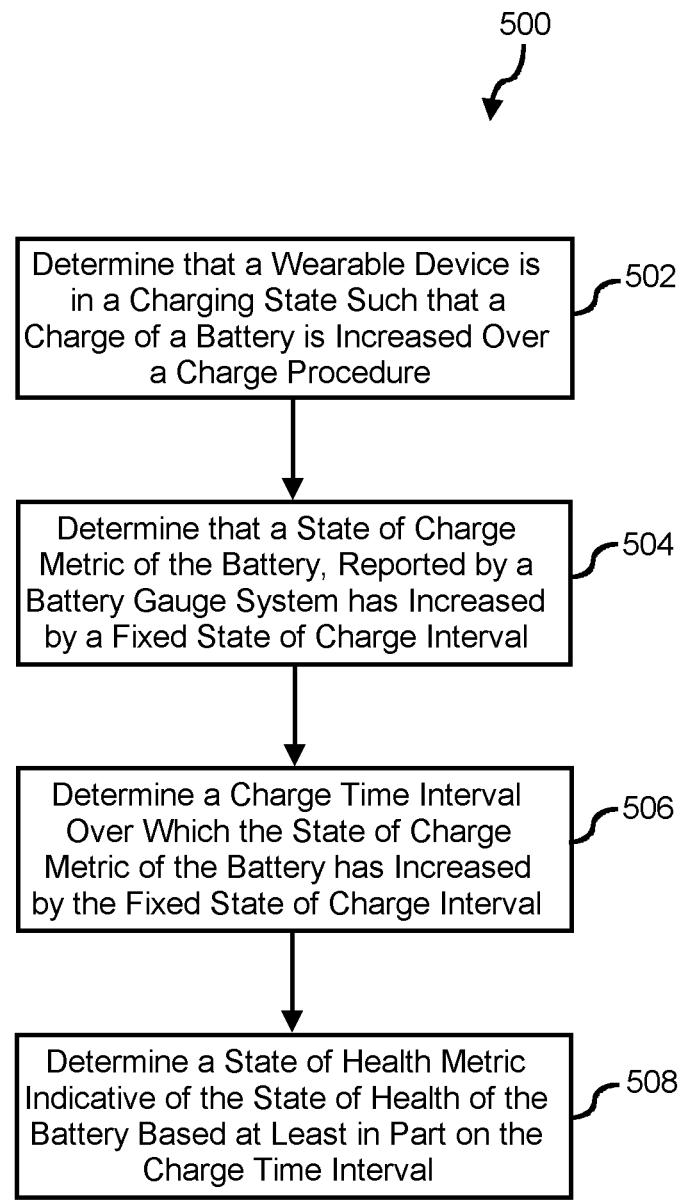
FIG. 5 depicts a flowchart diagram of an example method for improved determination of state of health of a battery of a wearable device according to example embodiments of the present disclosure.

Storage media and other non-transitory computer readable media for containing code, or portions of code, can include any appropriate media known or used in the art, such as but not limited to volatile and non-volatile, removable and non-removable media implemented in any method or technology for storage of information such as computer readable instructions, data structures, program modules or other data, including RAM, ROM, EEPROM, flash memory or other memory technology, CD-ROM, digital versatile disk (DVD) or other optical storage, magnetic cassettes, magnetic tape, magnetic disk storage or other magnetic storage devices or any other medium which can be used to store the desired information and which can be accessed by a system device FIG. 5 depicts a flow chart diagram of an example method to perform improved determination of state of health of a battery of a wearable device according to example embodiments of the present disclosure. Although FIG. 5 depicts steps performed in a particular order for purposes of illustration and discussion, the methods of the present disclosure are not limited to the particularly illustrated order or arrangement. The various steps of the method 500 can be omitted, rearranged, combined, and/or adapted in various ways without deviating from the scope of the present disclosure.

The method 500 can include, at 502, determining that the wearable device is in a charging state such that a charge of the battery is increased over a charge procedure. For instance, the wearable device may acknowledge that the device has been connected to a charger and/or is charging. As one example, in some implementations, determining that the wearable device is in the charging state can include requesting, from a charger coupled to the battery, a charging signal to be provided to the battery such that the charge of the battery is increased over time and receiving, from the charger coupled to the battery, the charging signal.

In some implementations, the charging state can be a constant current charging state over at least the charge time interval such that the battery receives a fixed (e.g., constant) current over the charge time interval. Additionally and/or alternatively, in some implementations, the charging state is configured to switch from the constant current charging state to a constant voltage charging state during the charge procedure. The charge time interval can be determined prior to the charging state switching from the constant current charging state to the constant voltage charging state. For instance, the charge time interval can occur while the device is in the constant current charging state such that the linear relationship between charge time and charge (e.g., current) is maintained.

Additionally, the computer-implemented method 500 can include, at 504, determining that the state of charge metric of the battery reported by the battery gauge system has increased by a fixed state of charge interval. The fixed state of charge interval can be any suitable interval, such as, for example, 1%, 5%, 10%, 20%, 30%, 50%, etc. Generally, while a larger state of charge interval can require more charge time to determine, it can be more precise for minor variations in state of charge etc. However, example aspects of the present disclosure can also be applied on smaller state of charge intervals for quicker determination of state of health while maintaining high accuracy.

In some implementations, determining that the state of charge metric of the battery reported by the battery gauge system has increased by the fixed state of charge interval can include obtaining a first state of charge measurement from the battery gauge system at a first time instance. Subsequent to obtaining the first state of charge measurement, determining that the state of charge metric reported by the battery gauge system has increased by the fixed state of charge interval can include obtaining a second state of charge measurement from the battery gauge system at a second time instance. The method can then include determining that the second state of charge measurement differs from the first state of charge measurement by the fixed state of charge interval. For instance, the second state of charge measurement can be subtracted from the first state of charge measurement to determine a present state of charge interval, which can be compared to the fixed state of charge interval.

Additionally, The method 500 can include, at 506, determining a charge time interval over which the state of charge metric of the battery has increased by the fixed state of charge interval. For instance, in some implementations, determining the charge time interval over which the state of charge metric of the battery has increased by the fixed state of charge interval can include subtracting the first time instance from the second time instance. For instance, the charge time interval can be the difference between the first time instance and the second time instance.

Additionally, The method 500 can include, at 508, determining a state of health metric indicative of the state of health of the battery based at least in part on the charge time interval. For instance, determining the state of health metric can be based at least in part on a known relationship between a reference time interval representative of time required to increase a reference battery at full state of health by the fixed state of charge interval and the charge time interval. As one example, the state of health metric can be a ratio between the charge time interval and the reference time interval. The ratio can thus represent the ratio between the amount of time required to charge the battery by a fixed state of charge and the time required to charge a full health battery by the same fixed state of charge. This ratio can thus correlate directly to state of health of the batter.

In some implementations, the method can further include providing, by the one or more processors, the state of health metric for display to a user. The state of health metric can be displayed to the user for evaluating a health of the battery. For example, the user may be provided with the state of health metric to make an informed decision on whether the battery should be replaced or serviced. As another example, the user may monitor the state of health of the battery to gauge how long a device will last from full charge.

As another example, the state of health metric can be used (e.g., by a diagnostic technician) to determine if performance issues with the wearable device are a result of a low state of health of the battery and/or additional causes. For instance, the state of health metric may be communicated to a diagnostic system during service of the wearable device. Based on the state of health metric, a user may be able to make an informed decision about which parts (e.g., the battery) of the wearable device need to be serviced to return the wearable device to optimal functionality.

Figure 6:
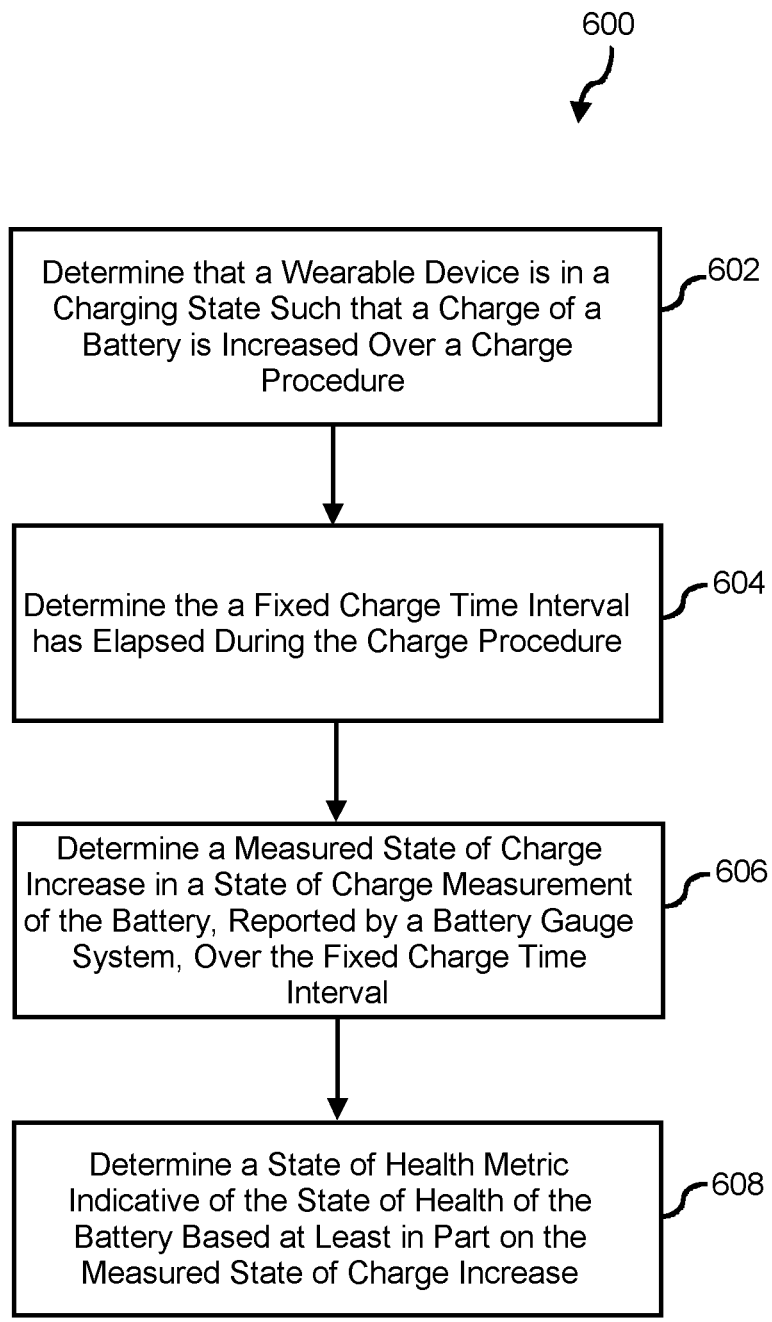
FIG. 6 depicts a flowchart diagram of an example method for improved determination of state of health of a battery of a wearable device according to example embodiments of the present disclosure.

FIG. 6 depicts a flow chart diagram of an example method to perform improved determination of state of health of a battery of a wearable device according to example embodiments of the present disclosure. Although FIG. 6 depicts steps performed in a particular order for purposes of illustration and discussion, the methods of the present disclosure are not limited to the particularly illustrated order or arrangement. The various steps of the method 600 can be omitted, rearranged, combined, and/or adapted in various ways without deviating from the scope of the present disclosure.

The method 600 can include, at 602, determining that the wearable device is in a charging state such that a charge of the battery is increased over a charge procedure. For instance, the wearable device may acknowledge that the device has been connected to a charger and/or is charging. As one example, in some implementations, determining that the wearable device is in the charging state can include requesting, from a charger coupled to the battery, a charging signal to be provided to the battery such that the charge of the battery is increased over time and receiving, from the charger coupled to the battery, the charging signal.

In some implementations, the charging state can be a constant current charging state over at least the charge time interval such that the battery receives a fixed (e.g., constant) current over the charge time interval. Additionally and/or alternatively, in some implementations, the charging state is configured to switch from the constant current charging state to a constant voltage charging state during the charge procedure. The charge time interval can be determined prior to the charging state switching from the constant current charging state to the constant voltage charging state. For instance, the charge time interval can occur while the device is in the constant current charging state such that the linear relationship between charge time and charge (e.g., current) is maintained.

Additionally, The method 600 can include, at 604, determining, by the one or more processors, that a fixed charge time interval has elapsed during the charge procedure. For instance, once the device is determined to be in a charging state, the device can wait until the fixed charge time interval has elapsed while the device is in the charging state.

Once the charge time interval has elapsed, The method 600 can include, at 606, determining, by the one or more processors, a measured state of charge increase in a state of charge measurement of the battery, reported by a battery gauge system, over the fixed charge time interval. For instance, the wearable device can record the state of charge of the battery at the beginning of the fixed charge time interval and/or at the end of the fixed charge time interval. For example, The method 600 can include obtaining a first state of charge measurement subsequent to determining that the wearable device is in the charging state. Additionally, The method 600 can include obtaining a second state of charge measurement subsequent to determining that the fixed charge time interval has elapsed during the charge procedure. The method can then include determining the measured state of charge increase as the difference between the second state of charge measurement and the first state of charge measurement.

The method 600 can include, at 608, determining, by the one or more processors, a state of health metric indicative of the state of health of the battery based at least in part on the measured state of charge increase. For instance, determining the state of health metric can be based at least in part on a known relationship between a reference state of charge increase representative of an expected increase in state of charge over the charge time interval of a reference battery at full state of health and the measured state of charge increase. For instance, in some implementations, the state of health metric can be or can include a ratio between the measured state of charge increase and the reference state of charge increase. This ratio can correlate to the state of health of the battery.

In some implementations, the method 600 can further include providing, by the one or more processors, the state of health metric for display to a user. The state of health metric can be displayed to the user for evaluating a health of the battery. For example, the user may be provided with the state of health metric to make an informed decision on whether the battery should be replaced or serviced. As another example, the user may monitor the state of health of the battery to gauge how long a device will last from full charge.

As another example, the state of health metric can be used (e.g., by a diagnostic technician) to determine if performance issues with the wearable device are a result of a low state of health of the battery and/or additional causes. For instance, the state of health metric may be communicated to a diagnostic system during service of the wearable device. Based on the state of health metric, a user may be able to make an informed decision about which parts (e.g., the battery) of the wearable device need to be serviced to return the wearable device to optimal functionality.

The technology discussed herein makes reference to servers, databases, software applications, and other computer-based systems, as well as actions taken and information sent to and from such systems. The inherent flexibility of computer-based systems allows for a great variety of possible configurations, combinations, and divisions of tasks and functionality between and among components. For instance, processes discussed herein can be implemented using a single device or component or multiple devices or components working in combination. Databases and applications can be implemented on a single system or distributed across multiple systems. Distributed components can operate sequentially or in parallel.

While the present subject matter has been described in detail with respect to various specific example embodiments thereof, each example is provided by way of explanation, not limitation of the disclosure. Those skilled in the art, upon attaining an understanding of the foregoing, can readily produce alterations to, variations of, and equivalents to such embodiments. Accordingly, the subject disclosure does not preclude inclusion of such modifications, variations and/or additions to the present subject matter as would be readily apparent to one of ordinary skill in the art. For instance, features illustrated or described as part of one embodiment can be used with another embodiment to yield a still further embodiment. Thus, it is intended that the present disclosure cover such alterations, variations, and equivalents.

What is claimed is:

1. A wearable device having improved determination of state of health of a battery of the wearable device, the wearable device comprising:
   a device housing;
   a battery disposed within at least a portion of the device housing;
   a battery gauge system configured to provide a state of charge metric indicative of a state of charge of the battery;
   one or more processors; and
   one or more non-transitory computer-readable media storing instructions, that, when implemented, cause the one or more processors to perform operations, the operations comprising:
      determining that the wearable device is in a charging state such that a charge of the battery is increased over a charge procedure;
      determining that the state of charge metric of the battery reported by the battery gauge system has increased by a fixed state of charge interval;
      determining a charge time interval over which the state of charge metric of the battery has increased by the fixed state of charge interval; and
      determining a state of health metric indicative of the state of health of the battery based at least in part on the charge time interval;
      wherein determining the state of health metric is based at least in part on a known relationship between a reference time interval representative of time required to increase a reference battery at full state of health by the fixed state of charge interval and the charge time interval.

2. The wearable device of claim 1, wherein determining that the wearable device is in the charging state comprises requesting, from a charger coupled to the battery, a charging signal to be provided to the battery such that the charge of the battery is increased over time; and
   receiving, from the charger coupled to the battery, the charging signal.

3. The wearable device of claim 1, wherein the charging state comprises a constant current charging state over at least the charge time interval such that the battery receives a fixed current over the charge time interval.

4. The wearable device of claim 3, wherein the charging state is configured to switch from the constant current charging state to a constant voltage charging state during the charge procedure, and wherein the charge time interval is determined prior to the charging state switching from the constant current charging state to the constant voltage charging state.

5. The wearable device of claim 1, wherein the battery gauge system is configured to provide the state of charge metric indicative of the state of charge of the battery based at least in part on one or more battery charge factors, the one or more battery charge factors comprising one or more of a measured battery voltage, a reference battery voltage, battery age, battery temperature, battery current draw, battery usage, battery transient status, battery chemistry, battery model, battery make, or one or more calibration factors.

6. The wearable device of claim 1, wherein determining that the state of charge metric of the battery reported by the battery gauge system has increased by the fixed state of charge interval comprises:

obtaining a first state of charge measurement from the battery gauge system at a first time instance;

subsequent to obtaining the first state of charge measurement, obtaining a second state of charge measurement from the battery gauge system at a second time instance; and determining that the second state of charge measurement differs from the first state of charge measurement by the fixed state of charge interval.

7. The wearable device of claim 6, wherein determining the charge time interval over which the state of charge metric of the battery has increased by the fixed state of charge interval comprises subtracting the first time instance from the second time instance.

8. The wearable device of claim 1, wherein the state of charge metric is expressed incrementally as a percentage between a fully charged state of the battery and an empty state of the battery.

9. The wearable device of claim 1, wherein the state of health metric comprises a ratio between the charge time interval and the reference time interval.

10. The wearable device of claim 1, wherein the wearable device comprises at least one of a smartwatch, a wearable fitness tracker, a pedometer, a wearable electrocardiogram device, or an activity tracker.

11. A computer-implemented method for improved determination of state of health of a battery of a battery-powered device, the computer-implemented method comprising:

determining, by one or more processors, that the battery-powered device is in a charging state such that a charge of the battery is increased over a charge procedure;

determining, by the one or more processors, that a state of charge metric of the battery, reported by a battery gauge system, has increased by a fixed state of charge interval;

determining, by the one or more processors, a charge time interval over which the state of charge metric of the battery has increased by the fixed state of charge interval; and determining, by the one or more processors, a state of health metric indicative of the state of health of the battery based at least in part on the charge time interval;

wherein determining the state of health metric is based at least in part on a known relationship between a reference time interval representative of time required to increase a reference battery at full state of health by the fixed state of charge interval and the charge time interval.

12. The computer-implemented method of claim 11, wherein determining that the battery-powered device is in the charging state comprises requesting, from a charger coupled to the battery, a charging signal to be provided to the battery such that the charge of the battery is increased over time; and receiving, from the charger coupled to the battery, the charging signal.

13. The computer-implemented method of claim 11, wherein the charging state comprises a constant current charging state over at least the charge time interval such that the battery receives a constant current over the charge time interval.

14. The computer-implemented method of claim 11, wherein determining that the state of charge metric of the battery reported by the battery gauge system has increased by the fixed state of charge interval comprises:

obtaining a first state of charge measurement from the battery gauge system at a first time instance;

subsequent to obtaining the first state of charge measurement, obtaining a second state of charge measurement from the battery gauge system at a second time instance; and determining that the second state of charge measurement differs from the first state of charge measurement by the fixed state of charge interval.

15. The computer-implemented method of claim 14, wherein determining the charge time interval over which the state of charge metric of the battery has increased by the fixed state of charge interval comprises subtracting the first time instance from the second time instance.

16. The computer-implemented method of claim 11, further comprising providing, by the one or more processors, the state of health metric for display to a user.

17. A computer-implemented method for improved determination of state of health of a battery of a battery-powered device, the computer-implemented method comprising:

determining, by one or more processors, that the battery-powered device is in a charging state such that a charge of the battery is increased over a charge procedure;

determining, by the one or more processors, that a fixed charge time interval has elapsed during the charge procedure;

determining, by the one or more processors, a measured state of charge increase in a state of charge measurement of the battery, reported by a battery gauge system, over the fixed charge time interval; and determining, by the one or more processors, a state of health metric indicative of the state of health of the battery based at least in part on the measured state of charge increase;

wherein determining the state of health metric is based at least in part on a known relationship between a reference state of charge increase representative of an expected increase in state of charge over the charge time interval of a reference battery at full state of health and the measured state of charge increase.

18. The computer-implemented method of claim 17, wherein the state of health metric comprises a ratio between the measured state of charge increase and the reference state of charge increase.

19. The computer-implemented method of claim 17, wherein the charging state comprises a constant current charging state over at least the fixed charge time interval such that the battery receives a constant current over the charge time interval.

20. The computer-implemented method of claim 17, further comprising providing, by the one or more processors, the state of health metric for display to a user.

* * * * *